United States Patent
Zeng

(10) Patent No.: US 9,031,452 B2
(45) Date of Patent: May 12, 2015

(54) METHOD FOR RESTORING IMAGING CARTRIDGE CHIP

(75) Inventor: Yangyun Zeng, Guangdong (CN)

(73) Assignee: Apex Microelectronics Co., Ltd., Guangdong (CN)

( * ) Notice: Subject to any disclaimer, the term of this patent is extended or adjusted under 35 U.S.C. 154(b) by 19 days.

(21) Appl. No.: 14/007,220

(22) PCT Filed: Mar. 27, 2012

(86) PCT No.: PCT/CN2012/073079
§ 371 (c)(1),
(2), (4) Date: Nov. 12, 2013

(87) PCT Pub. No.: WO2013/033987
PCT Pub. Date: Mar. 14, 2013

(65) Prior Publication Data
US 2014/0056611 A1  Feb. 27, 2014

(30) Foreign Application Priority Data
Sep. 9, 2011  (CN) .......................... 2011 1 0268245

(51) Int. Cl.
*G03G 15/00* (2006.01)
*G03G 21/16* (2006.01)
*G03G 15/08* (2006.01)
*G03G 21/00* (2006.01)
*B41J 2/175* (2006.01)

(52) U.S. Cl.
CPC ............ *G03G 21/16* (2013.01); *G03G 15/0863* (2013.01); *G03G 21/00* (2013.01); *B41J 2/17546* (2013.01); *B41J 2/17559* (2013.01); *G03G 2215/00987* (2013.01)

(58) Field of Classification Search
CPC ... G03G 15/0863; G03G 21/00; G03G 21/16; G03G 2215/00987
USPC ..................... 399/109, 25, 106, 111, 107, 262
See application file for complete search history.

(56) References Cited

U.S. PATENT DOCUMENTS

2003/0237061 A1*  12/2003  Miller et al. ...................... 716/4
2007/0297828 A1*  12/2007  Causey et al. ................. 399/109
2008/0219692 A1   9/2008  Kondo

FOREIGN PATENT DOCUMENTS

| CN | 101121328 | 2/2008 |
| CN | 102173208 | 1/2011 |
| JP | 2006059301 | 3/2006 |

OTHER PUBLICATIONS

International Search Report for Corresponding International Application No. PCT/CN2012/073079 mailed Jun. 14, 2012.

* cited by examiner

*Primary Examiner* — Roy Y Yi
(74) *Attorney, Agent, or Firm* — Swanson & Bratschun, L.L.C.

(57) ABSTRACT

A method for restoring an imaging cartridge chip, applicable in the technical field of imaging. In the process of restoring the imaging cartridge chip, a laser beam is used at least to unseal a location where a functional interface is on a storage device comprised in the imaging cartridge chip, or at least to scratch open or to drill open packaging material at the location where the functional interface is, then restore data is written into the storage device via the functional interface and a read/write interface. This results in the repair of the imaging cartridge chip.

21 Claims, 3 Drawing Sheets

METHOD FOR RESTORING IMAGING CARTRIDGE CHIP

RELATED APPLICATIONS

This application is a 35 U.S.C. §371 national phase application of PCT international application PCT/CN2012/073079 (WO 2013/033987), filed on Mar. 27, 2012, entitled "Method for Restoring Imaging Cartridge Chip", which application claims the priority of Chinese Patent Application No. 201110268245.9, filed Sep. 9, 2011, which is incorporated herein by reference in its entirety.

This application claims the priority of Chinese Patent Application No. 201110268245.9, entitled "METHOD FOR RESTORING IMAGING CARTRIDGE CHIP", filed with the Chinese State Intellectual Property Office on Sep. 9, 2011, the content of which is incorporated herein by reference in its entirety.

FIELD OF THE INVENTION

The invention relates to the field of imaging technology, in particular to a method for repairing an image forming cartridge chip.

BACKGROUND OF THE INVENTION

Image forming cartridges (such as toner cartridges, cartridges, ink cartridges with print heads and the like) are mounted in an image forming apparatus (such as a printer and a duplicating machine). The image forming apparatus may utilize colorant, accommodated in the image forming cartridges, for imaging. When the colorant in the image forming cartridges is used up, the image forming cartridges can be recycled, thereby avoiding waste.

An image forming cartridge chip is usually arranged inside the image forming cartridge and used for storing information such as the model of the image forming cartridge, the colorant color, the production date, the colorant capacity, the remaining colorant amount, etc., and each image forming cartridge chip corresponds to each image forming cartridge. In addition, the recycle of the image forming cartridges includes the recycle of the image forming cartridge chips. In the prior art, in the case of the recycle of the image forming cartridge chips, the image forming cartridge chips must be subjected to screening and data are written into the image forming cartridge chips in the form of complete coverage.

In the process of writing the data into the image forming cartridge chips, functional interfaces on the image forming cartridge chips are required for use. However, as integrated circuits on the image forming cartridge chips are all encapsulated into encapsulating materials such as thermosetting plastics or hard shells for protection and certain functional ports are also encapsulated into the encapsulating materials, in the process of recycling the image forming cartridge chips by the writing of the data into the image forming cartridge chips, the encapsulating materials must be eroded by an acidic solvent so as to expose the functional ports, and hence the data are written into the image forming cartridge chips.

When the encapsulating materials are eroded by the acidic solvent in the process of recycling the image forming cartridge chips in the prior art, other lines and components on the image forming cartridge chips may be eroded, and thus the performances of the image forming cartridge chips may be affected.

SUMMARY OF THE INVENTION

The invention provides a method for repairing an image forming cartridge chip, so that the performances of the image forming cartridge chip cannot be affected during the recycle of the image forming cartridge chip.

The invention provides a method for repairing an image forming cartridge chip provided with a storage device, which comprises the following steps of:

at least unsealing at functional interfaces on the storage device with laser beams, or at least scraping away or drilling through encapsulating materials at the functional interfaces on the storage device; and writing repair data into the storage device through read-write interfaces and the functional interfaces of the image forming cartridge chip.

In the process of repairing the image forming cartridge chip in the embodiment of the invention, laser beams are used for at least unsealing at functional interfaces on a storage device in the image forming cartridge chip or at least encapsulating materials at the functional interfaces are scraped away or drilled through; and hence, repair data are written into the storage device through the functional interfaces and read-write interfaces. Therefore, the unsealing parameters, for example, the unsealing caliber and the unsealing depth, are easier to control when the laser beams or the method of scraping or drilling is used for unsealing in the case of unsealing, and other lines and components on the image forming cartridge chip cannot be easily damaged, and thus the performances of the image forming cartridge chip cannot be affected.

BRIEF DESCRIPTION OF THE DRAWINGS

Simple description will be given below to the accompanying drawings relating to the embodiments or the description of the prior art to give a more clear understanding of the embodiments of the invention or the technical proposal in the prior art. It will be obvious to those skilled in the art that the drawings as described below are only partial embodiments of the invention and other drawings may be made by those skilled in the art on the basis of the drawings without creative efforts.

DETAILED DESCRIPTION OF THE INVENTION

Clear and complete description will be given to the technical proposals of the embodiments of the invention with reference to the accompanying drawings of the embodiments of the invention. Obviously, the embodiments illustrated are only partial embodiments of the invention and not all the embodiments. All the other embodiments made by those skilled in the art on the basis of the embodiments of the invention without creative efforts shall fall within the scope of protection of the invention.

The invention provides a method for repairing an image forming cartridge chip, which is used for repairing data stored into the image forming cartridge chip in the process of recycling the image forming cartridge chip or in the process of the failure recovery of the image forming cartridge chip.

Figure 1:
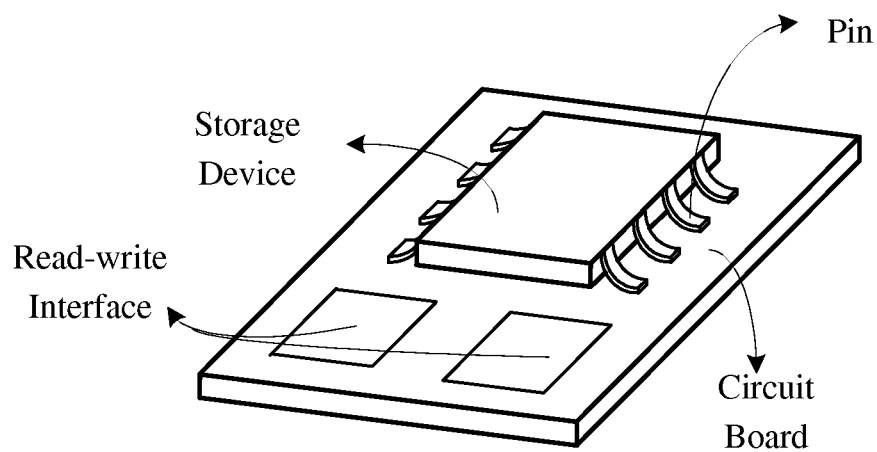
FIG. 1 is a schematic structural view of an image forming cartridge chip.

As illustrated in FIG. 1, the image forming cartridge chip typically comprises a circuit board, a plurality of read-write interfaces (taking two for example in the embodiment) and a storage device, wherein the read-write interfaces and the storage device are subjected to circuit connection (not illustrated in FIG. 1); the read-write interfaces are arranged on the circuit board by means of electric contact; the storage device is used for storing information such as the model of the image forming cartridge chip, the colorant color, the production date, the colorant capacity, the remaining colorant amount and the like; and an integrated circuit is encapsulated by thermosetting plastics or a hard shell; and communication ports are led out to the circuit board via pins.

Figure 2:
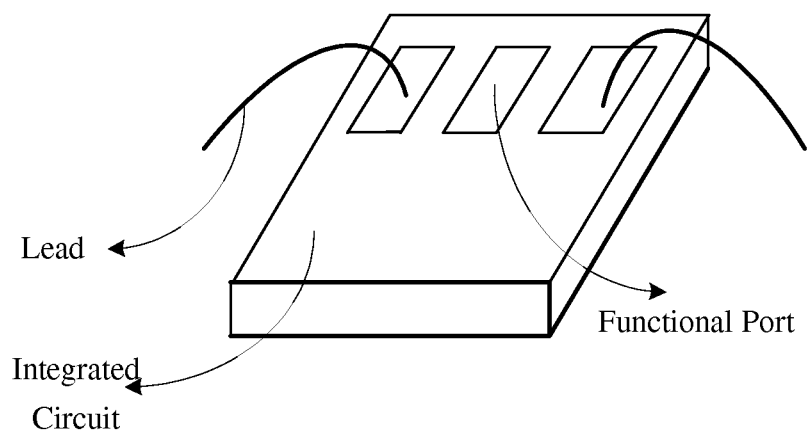
FIG. 2 is a schematic structural view of a storage device in the image forming cartridge chip.

The integrated circuit in the storage device is typically composed of semiconductors, namely wafers, and a plurality of the communication ports are usually arranged on the surface of the integrated circuit. As illustrated in FIG. 2, the communication ports required are usually connected to external pins or the circuit board via leads before the encapsulation of the integrated circuit. In addition, a plurality of functional ports used for special operations such as enabling and controlling are usually arranged on the surface of the integrated circuit, and are not connected to the external pins or the circuit board via leads in view of the layout of the circuit board.

In the process of repairing the data in the image forming cartridge chip, partial functional ports of the integrated circuit may be required. More specifically, laser beams may be used for at least unsealing at functional interfaces on the storage device of the image forming cartridge chip, or at least encapsulating materials at the functional interfaces on the storage device are scraped away or drilled through; and hence, repair data are written into the storage device through the read-write interfaces and the functional interfaces of the image forming cartridge chips. Therefore, the unsealing parameters, for example, the unsealing caliber and the unsealing depth, are easier to control when the laser beams or the method of scraping or drilling is used for unsealing in the case of unsealing, and other lines and components on the image forming cartridge chip cannot be easily damaged, and thus the performances of the image forming cartridge chip cannot be affected.

In the process of unsealing, all the encapsulating materials on the storage device may be removed, and the mode of only removing the encapsulating materials at specific positions of the storage device may also be adopted.

Figure 3:
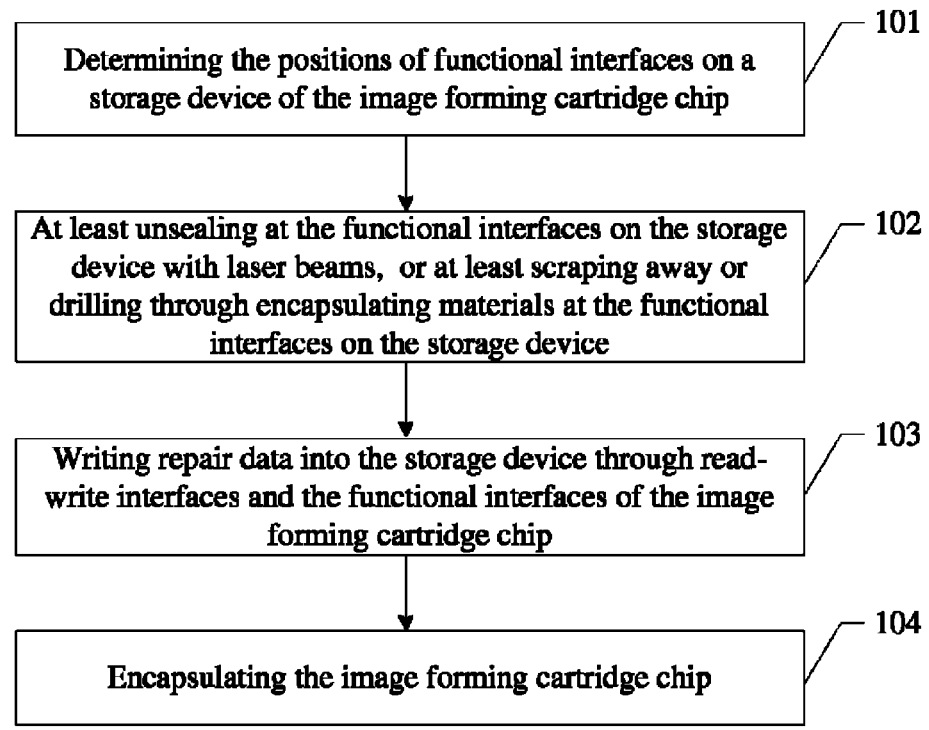
FIG. 3 is a flow chart of a method for repairing the image forming cartridge chip, provided by the invention.

In a specific embodiment, the image forming cartridge chip may be repaired by the following steps. The flow chart is as illustrated in FIG. 3. The method comprises the following steps of:

Step 101: determining the positions of functional interfaces on a storage device of the image forming cartridge chip.

In general, the functional interfaces are all arranged on the outer surface of an integrated circuit in the storage device, and the inner surface of the integrated circuit is one side adjacent to a circuit board. In addition, when data are written into the storage device, partial functional interfaces on the surface of the integrated circuit may be required. Therefore, a user only needs to determine the positions of the required functional interfaces.

The functional interfaces are encapsulated into encapsulating materials, and the specific positions thereof cannot be seen from the outer surface of the image forming cartridge chip. However, as for image forming cartridge chips with identical characteristics such as model or dimension, the positions of the functional interfaces in the storage devices are identical, and thus the specific positions of the functional interfaces in the storage devices of the image forming cartridge chips can be known from the model or dimension and other characteristics of the image forming cartridge chips. In addition, the positions of the functional interfaces of certain image forming cartridge chips may also be acquired from the external features of the image forming cartridge chips, such as shape, layout, dimension and the like.

Step 102: at least unsealing at the functional interfaces on the storage device with laser beams, or at least scraping away or drilling through the encapsulating materials at the functional interfaces on the storage device.

The process of at least unsealing at the functional interfaces refers to the process of at least removing the encapsulating materials covered at the functional interfaces on the surface of the integrated circuit, namely not just unsealing at the functional interfaces. In the embodiment, the following modes may be adopted for unsealing:

(1) Unsealing with laser beams: as the laser beam has the characteristics of high energy, small convergent points, controllable power and the like, the unsealing caliber, the unsealing depth, the unsealing time and the like can be conveniently controlled. Compared with the prior art adopting the acidic solvent for unsealing, the method of the embodiment has the characteristics of high accuracy, high efficiency, safety, environmental protection, etc.

In order for safer unsealing without causing damage to the functional interfaces on the integrated circuit in the storage device, the laser beams can be at least irradiated at the functional interfaces on the storage device for a plurality of times so as to burn out the encapsulating materials. In addition, the sum of the unsealing depths resulted from the irradiation of the laser beams for a plurality of times is less than or equal to the thickness of the encapsulating materials at the functional interfaces, so that the unsealing depth can be more accurately controlled. For example, in an unequal manner, three fifths of target encapsulating materials are burned out by the laser beams at first, and then the remaining two fifths of the target encapsulating materials are burned out. Or alternatively, in an equal manner, half of the target encapsulating materials are burned out by the laser beams at first, and then the remaining half of the target encapsulating materials are burned out.

The calibers formed by the irradiation of the laser beams for a plurality of times, namely the unsealing calibers, may be different from each other and are successively reduced. When the laser beams are used for unsealing on the storage device, the unsealing calibers of different types of image forming cartridge chips have different shapes, for example, the unsealing caliber may be square, round, trapezoidal, triangular, etc., so that different image forming cartridge chips may be distinguished by the unsealing caliber.

(2) At least removing the encapsulating materials covered at the functional interfaces on the storage device with a scraper.

(3) At least removing the encapsulating materials covered at the functional interfaces on the storage device with a drilling tool, in which the unsealing caliber, the unsealing depth and the like can be controlled by adoption of the scraper or the drilling tool for unsealing.

It should be noted that an encapsulating material layer may be at least retained on wafer surfaces of the functional interfaces in the process of unsealing by adoption of the above modes, in the actual operation in order to improve the safety of unsealing, and thus the surface of the integrated circuit may not be damaged and the oxidized area may be reduced as well. But when the functional interfaces are used, the encapsulating material layer must be penetrated through before the connection with the functional interfaces.

Figure 4:
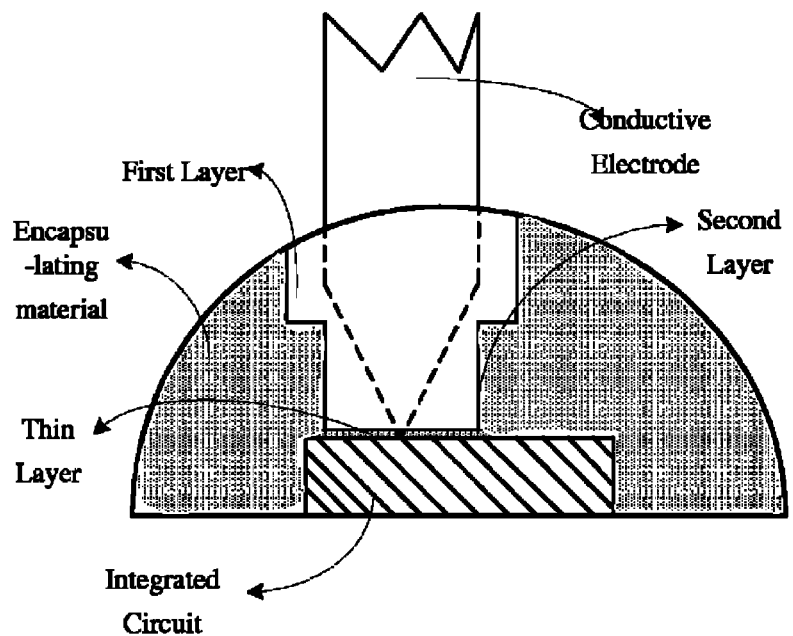
FIG. 4 is a schematic structural view illustrating the unsealing state of the storage device of the image forming cartridge chip in the embodiment of the invention.

For example, as illustrated in FIG. 4, the laser beams are irradiated at the functional interfaces on the storage device by equal means for unsealing; the target encapsulating materials are burned out in twice by the laser beams with different unsealing calibers, and the unsealing caliber of a second layer is narrowed than that of a first layer; and the encapsulating material layer is retained on the wafer surfaces of the integrated circuit during the unsealing. Therefore, by adoption of the unsealing means, the functional interfaces can be more accurately connected when used, and the encapsulating materials required for the encapsulation of the image forming cartridge chip can be reduced.

Step 103: writing repair data into the storage device through read-write interfaces and the functional interfaces of the image forming cartridge chip.

When the repair data are written, the read-write interfaces and the functional interfaces can be connected to a repair data writing device which in turn writes the repair data into the storage device of the image forming cartridge chip.

Step 104: encapsulating the image forming cartridge chip.

The encapsulation of the image forming cartridge chip mainly refers to that: the part burned out or scraped away or drilled through in the step 102 is refilled with encapsulating materials, and hence the refilled encapsulating materials are fixed by further roasting or cooling for different encapsulating materials. If the unsealing is only performed at the functional interfaces on the storage device, only the part is required for encapsulation during the encapsulation, so that the encapsulating materials can be saved.

The refilled encapsulating materials may be different from the original encapsulating materials, so that whether the image forming cartridge chip is a recovery product can be determined through the encapsulating materials. Moreover, different encapsulating materials may be used for encapsulating different types of image forming cartridge chips, so that the different image forming cartridge chips can be distinguished through the encapsulating materials.

In the process of repairing the image forming cartridge chip in the embodiment of the invention, firstly, the laser beams are used for unsealing at the functional interfaces or the encapsulating materials at the functional interfaces are scraped away or drilled through after the positions of the functional interfaces are determined; secondly, the repair data are written into the storage device through the functional interfaces and the read-write interfaces; and thirdly, the image forming cartridge chip is encapsulated at last. In this way, the unsealing is only performed at the functional interfaces and the unsealing methods such as the adoption of the laser beams are easier to control, so that other lines and components on the image forming cartridge chip cannot be easily damaged, and thus the performances of the image forming cartridge chip cannot be affected.

Figure 5:
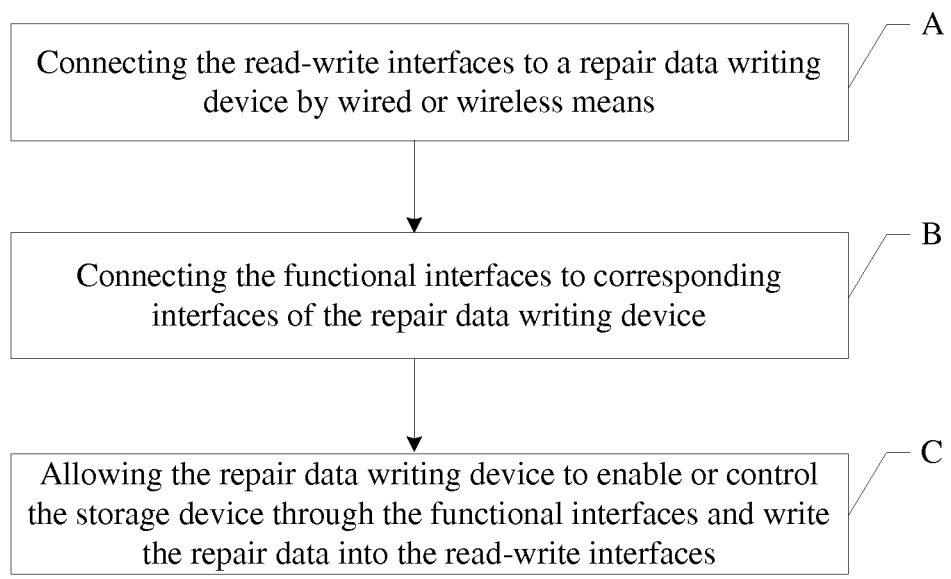
FIG. 5 is a flow chart of a process for writing repair data into the storage device, in the embodiment of the invention.

As illustrated in FIG. 5, in a specific embodiment, the step 103 may further comprise the following steps of:

A: connecting the read-write interfaces to the repair data writing device by wired or wireless means.

When the read-write interfaces are connected with the repair data writing device by wireless means, antennas may be arranged on the read-write interfaces and corresponding antennas may be arranged on the repair data writing device, so as to achieve communication.

In addition, the repair data writing device and the read-write interfaces are not limited to be connected with each other by the wireless means, and may also be connected with each other through leads.

The repair data writing device herein is used for writing the data to be repaired into the storage device of the image forming cartridge chip.

B: connecting the functional interfaces to corresponding interfaces of the repair data writing device.

If the encapsulating material layer is not retained on the wafer surfaces of the functional interfaces during the unsealing in the step 102, namely the wafer surfaces of the functional interfaces are exposed, the functional interfaces are directly connected with the corresponding interfaces of the repair data writing device.

If the encapsulating material layer is retained on the wafer surfaces of the functional interfaces during the unsealing in the step 102, the functional interfaces are connected with the repair data writing device through a conductive electrode. As illustrated in FIG. 4, one end of the conductive electrode may press against the functional interfaces so as to penetrate through the retained encapsulating material layer and make direct contact with the functional interfaces, and the other end of the conductive electrode is connected with the corresponding interfaces of the repair data writing device.

C: allowing the repair data writing device to enable or control the storage device through the functional interfaces and write the repair data into the read-write interfaces.

The repair data herein refer to the information such as the model of the image forming cartridge, the colorant color, the production date, the colorant capacity or the remaining colorant amount and the like, so as to be matched with the image forming cartridge refilled with colorant.

More specifically, in the process of writing the repair data, according to the functions of the functional interfaces, time-sequence signals may be sent to the functional interfaces to control the read-write time sequence of the storage device, and control signals may be also sent to the functional interfaces to enable the storage device. As such, the storage device may enter another mode by the enabling of the functional interfaces. For example, when the current mode of the storage device is that the stored data cannot be modified, the data stored into the storage device can be rewritten after the enabling of the functional interface. Moreover, for example, when the current mode of the storage device is that the remaining colorant amount stored into the storage device cannot be rewritten to be larger, the remaining colorant amount stored into the storage device can be rewritten to be larger through the enabling of the functional interface.

Moreover, the repair data writing device may directly write part or all of the repair data into the read-write interfaces, and hence corresponding data originally stored into the storage device are covered by the repair data received by the read-write interfaces. For example, when the repair data writing device writes the information such as the remaining colorant amount and the production date into the storage device, the remaining colorant amount and the production date, originally stored into the storage device, may be covered by the written data. In addition, the repair data writing device may also write the information such as the model and the classification of the image forming cartridge chip into the storage device to cover the original information. As such, after the data in the image forming cartridge chip are repaired, the image forming cartridge chip may be matched with an image forming cartridge of other model.

Before writing the repair data into the storage device, the repair data writing device may also read the information, such as the model and the classification of the image forming cartridge chip, originally stored into the storage device from the read-write interfaces at first, and at least writes the information such as the remaining colorant amount and/or the consumed colorant amount, matched with the image forming cartridge corresponding to the information such as the model and the classification of the image forming cartridge, into the storage device. As for colorant with a shelf life, the production date may be written into the storage device.

It should be noted that the steps A and B have no absolute sequential relationship and may be executed simultaneously and may also be executed sequentially. In addition, the process of writing the repair data aims at the repair data required to be enabled or controlled through the functional interfaces, and the repair data not required to be enabled or controlled through the functional interfaces are directly written into the read-write interfaces.

Moreover, the step B is executed when the functional interfaces are required for use. For example, when the remaining colorant amount and the production date are required to be written into the storage device but the production date in the storage device cannot be modified, the functional interfaces are required for enabling the storage device when the production date is written in the process of writing the repair data, and thus both the read-write interfaces and the functional interfaces must be connected to the repair data writing device; and when the remaining colorant amount is written, the remaining colorant amount can be written only by connecting the read-write interfaces to the repair data writing device, and thus the functional interfaces and the repair data writing device can be disconnected.

Furthermore, the functional interfaces in the embodiment of the invention are not limited to interfaces encapsulated into the encapsulating materials, and the read-write interfaces are not limited to the interfaces do not encapsulated into the encapsulating materials as well. As for specific image forming cartridge chips, partial special repair data, for example, data such as verification password and the like, may be written into the storage device from the functional interfaces.

In other specific embodiments, in order to achieve more efficient and accurate repair of the image forming cartridge chips, the collected old and useless image forming cartridge chips are required for pretreatment before the step 101. The pretreatments include appearance screening, identification of the physical characteristics and/or data features, classification, dust removing and the like. Subsequently, the steps 101 to 104, namely the steps of the determination of the positions of the functional interfaces, unsealing, repair data writing, and encapsulation, are executed on the image forming cartridge chips after pretreatment.

It is to be understood that in the image forming cartridge chips collected by the user, some have different shapes and dimensions, some have different models, some are damaged, some are dusty, some are gummed, . . . , so that the appearance screening may be performed at first, for example, the image forming cartridge chips which are not damaged are selected.

Subsequently, the identification of the data features and/or electrical characteristics may be performed, namely the image forming cartridge chips of which the data features and/or electrical characteristics are in conformity with the preset rules are selected. The data feature refers to the feature of the image forming cartridge chip in the process of data read-write. For example, when the data are read and written from the read-write interfaces of the image forming cartridge chip, if the image forming cartridge chip responds or response data are in conformity with the preset rules, the image forming cartridge chip can be identified.

In addition, the electrical characteristic refers to the characteristic of an inherent circuit in the image forming cartridge chip. For example, the information such as the voltage, current or frequency of the image forming cartridge chip is within a certain range, or certain capacitor is in the process of charging and discharging.

Moreover, the classification may also be performed according to the shape, layout, dimension and the like of the image forming cartridge chips, so as to provide convenience for the subsequent determination of the positions of the functional interfaces and then achieve more efficient repair of the image forming cartridge chips. In addition, the classification treatment may be performed before or after the step of screening.

Furthermore, the image forming cartridge chips may also be subjected to cleaning treatment, for example, washing or blowing off the dust and removing the gum on the gummed chips. The cleaning treatment herein may be performed before or after the screening treatment, and the sequence is not limited.

It should be noted that: in the process of recycling the image forming cartridge chips, not all the pretreatment processes should be executed and at least one treatment should be selected; the steps 101 to 104 are executed on the treated image forming cartridge chips; but as the step of identifying the data features and/or electrical characteristics is an important step and may directly affect the success of the repair of the image forming cartridge chips, the identification of the data features and/or electrical characteristics must be carried out in general, namely the image forming cartridge chips of which the data features and/or electrical features are in conformity with the preset rules are selected and hence the steps of the determination of the positions of the functional interfaces, unsealing, repair data writing and encapsulation are executed on the selected image forming cartridge chips.

In another case, the identification of the electrical characteristics and/or data features of the image forming cartridge chips is not limited to be executed before the step 101, namely the step of determining the positions of the functional interfaces, and may be executed before the step 103, namely the step of writing the repair data into the storage device, in which case the repair data writing device may identify the electrical characteristics and/or data features of the storage device in the image forming cartridge chip. In this case, the repair data writing device has the function of identifying the electrical characteristics and/or data features.

In other specific embodiments, the writing of the repair data may fail due to the factor of instable interface contact, the damage of the storage device and the like in the process of writing the repair data. In this case, the image forming cartridge chips are required for detection whether the written repair data are partially damaged or not after the step 103 and before the step 104, namely the step of encapsulation. If the written repair data are partially damaged, it indicates that partial data are correctly written into the storage device in the process of writing the repair data and the storage device is not damaged, and thus the step 103 and the detection step may be repeated. If the written repair data are not damaged, the step of encapsulation in the step 104 may be executed. If the written repair data are completely damaged, it indicates that the storage device is damaged, and thus the image forming cartridge chip should be discarded. Therefore, the efficiency of the recycle of the image forming cartridge chips can be greatly improved.

In the process of detecting whether the written repair data are partially damaged or not, a testing apparatus may be connected to the read-write interfaces of the chip in wired or wireless means, and may also be connected to the functional interfaces for assistant detection according to the requirements of different models of image forming cartridge chips.

More specifically, the data features and/or electrical characteristics of the image forming cartridge chips into which the repair data are written may be detected. For example, the testing apparatus sends read-write data to the read-write interfaces of the image forming cartridge chip, and the data features are detected if the data returned by the image forming cartridge chip are in conformity with the preset rules. In addition, the testing apparatus also sends certain information relating to the voltage, current or frequency to the image forming cartridge chip and determines, for example, whether the voltage, current or frequency of the information returned by the image forming cartridge chip is within a certain range, whether certain capacitor in the image forming cartridge chip is in the process of charging and discharging, according to the information returned by the image forming cartridge chip, and hence the electrical characteristics are detected.

It should be noted that the repair data writing device used in the step 103 of writing the repair data may have the function of writing the repair data into the storage device and may also integrally have the functions of identifying the electrical characteristics and/or data features and detecting whether the repair data written into the storage device are partially damaged or not. As such, an additional detecting apparatus is not required in the detection step before the step 104, namely the step of encapsulating the image forming cartridge chip, and the repair data writing device is directly used for sequentially completing the steps of identification, data writing and detection.

Detailed description is given above to the method for repairing the image forming cartridge chip, provided by the embodiment of the invention. The principles and embodiments of the invention have been illustrated by way of specific examples. The description of the embodiments is only intended to help understanding the methods and core ideas of the invention. Meanwhile, modifications may be made to the specific embodiments and the application range by those skilled in the art on the basis of the concept of the invention. In summary, the description shall not be construed as to the limitation of the invention.

The invention claimed is:

1. A method for repairing an image forming cartridge chip provided with a storage device comprising:
    at least one of; unsealing functional interfaces on the storage device with one or more laser beams, scraping away or drilling through encapsulating materials at the functional interfaces on the storage device; and
    writing repair data into the storage device through read-write interfaces and the functional interfaces of the image forming cartridge chip.

2. The method according to claim 1 further comprising determining the positions of the functional interfaces on the storage device of the image forming cartridge chip before the step of unsealing the functional interfaces on the storage device with one or more laser beams, scraping away or drilling through the encapsulating materials at the functional interfaces on the storage device.

3. The method according to claim 1 further comprising unsealing the functional interfaces on the storage device with one or more laser beams by irradiating the functional interfaces on the storage device with the one or more laser beams a plurality of times, in which the sum of the unsealing depths resulting from the irradiation of the functional interfaces with the one or more laser beams for a plurality of times is less than or equal to the thickness of the encapsulating materials at the functional interfaces.

4. The method according to claim 3 wherein a plurality of unsealing calibers resulting from the irradiation of the functional interfaces with the laser beams for a plurality of times are different from each other and reduced successively.

5. The method according to claim 4 wherein the unsealing calibers have different shapes when the one or more laser beams are used for unsealing the functional interfaces on storage devices of different types of image forming cartridge chips.

6. The method according to claim 1 further comprising encapsulating the image forming cartridge chip, whereby different encapsulating materials are used for encapsulating different types of image forming cartridge chips during the encapsulation of the image forming cartridge chip.

7. The method according to claim 1, wherein the step of writing the repair data into the storage device through the read-write interfaces and the functional interfaces of the image forming cartridge chip further comprises:
    connecting the read-write interfaces to a repair data writing device by wired or wireless means;
    connecting the functional interfaces to corresponding interfaces of the repair data writing device; and
    causing the repair data writing device to enable or control the storage device through the functional interfaces and write the repair data into the read-write interfaces.

8. The method according to claim 7, wherein an encapsulating material layer is retained on a wafer surface of the functional interfaces after the process of unsealing the functional interfaces on the storage device with the one or more laser beams or scraping away or drilling through the encapsulating materials at the functional interfaces on the storage device, and wherein, the step of connecting the functional interfaces to the corresponding interfaces of the repair data writing device further comprises the steps of:
    providing for one end of a conductive electrode to penetrate through the encapsulating material layer retained on the wafer surfaces of the functional interfaces and make contact with the functional interfaces, and
    providing for the other end of the conductive electrode to be connected with the corresponding interfaces of the repair data writing device.

9. The method according to claim 7, further comprising:
    causing the repair data writing device to read, from the read-write interfaces, the model and the classification of an image forming cartridge originally stored into the storage device before the step of writing the repair data into the read-write interfaces;
    and wherein the step of writing the repair data into the read-write interfaces further comprises
    writing the remaining colorant amount and/or the consumed colorant amount, matched with the image forming cartridge corresponding to the model and the classification of the image forming cartridge, into the read-write interfaces.

10. The method according claim 1 further comprising selecting an image forming cartridge chip of which the electrical characteristics and/or data features are in conformity with preset rules, and executing the steps of unsealing and repair data writing on the selected image forming cartridge chip before the step of unsealing at the functional interfaces on the storage device with one or more laser beams or scraping away or drilling through the encapsulating materials at the functional interfaces on the storage device.

11. The method according to claim 7 further comprising detecting whether the repair data written into the storage device are partially damaged and repeating the steps of repair data writing and detection if so, after the step of writing the repair data into the storage device through the read-write interfaces and the functional interfaces of the image forming cartridge chip.

12. The method according to claim 2 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

13. The method according to claim 3 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

14. The method according to claim 4 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

15. The method according to claim 5 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

16. The method according to claim 6 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

17. The method according to claim 7 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

18. The method according to claim 8 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

19. The method according to claim 9 further comprising selecting an image forming cartridge chip of which the electrical characteristics or data features are in conformity with preset rules, and executing the steps of unsealing and repair data writing on the selected image forming cartridge chip before the step of unsealing the functional interfaces on the storage device with laser beams or scraping away or drilling through the encapsulating materials at the functional interfaces on the storage device.

20. The method according to claim 8 further comprising detecting whether the repair data written into the storage device are partially damaged and repeating the steps of repair data writing and detection if so, after the step of writing the repair data into the storage device through the read-write interfaces and the functional interfaces of the image forming cartridge chip.

21. The method according to claim 9 further comprising detecting whether the repair data written into the storage device are partially damaged and repeating the steps of repair data writing and detection if so, after the step of writing the repair data into the storage device through the read-write interfaces and the functional interfaces of the image forming cartridge chip.

* * * * *